United States Patent
Chandra (10) Patent No.: US 7,659,748 B2
(45) Date of Patent: Feb. 9, 2010

(54) ELECTRONIC DEVICE AND INTEGRATED CIRCUIT

(75) Inventor: Sunil Chandra, Pithoragarh (IN)

(73) Assignee: NXP B.V., Eindhoven (NL)

( * ) Notice: Subject to any disclaimer, the term of this patent is extended or adjusted under 35 U.S.C. 154(b) by 1 day.

(21) Appl. No.: 12/293,241

(22) PCT Filed: Mar. 13, 2007

(86) PCT No.: PCT/IB2007/050848

§ 371 (c)(1),
(2), (4) Date: Sep. 16, 2008

(87) PCT Pub. No.: WO2007/105170

PCT Pub. Date: Sep. 20, 2007

(65) Prior Publication Data

US 2009/0085606 A1 Apr. 2, 2009

(30) Foreign Application Priority Data

Mar. 16, 2006 (EP) .................. 06111241

(51) Int. Cl.
*H03K 19/094* (2006.01)
*H03K 17/16* (2006.01)

(52) U.S. Cl. .................. 326/83; 326/86; 326/88; 326/27

(58) Field of Classification Search .................. 326/27, 326/83, 86, 87, 88, 121
See application file for complete search history.

(56) References Cited

U.S. PATENT DOCUMENTS

| 5,604,449 A * | 2/1997 | Erhart et al. .................. 326/81 |
| 5,973,534 A | 10/1999 | Singh |
| 6,081,132 A | 6/2000 | Isbara |
| 6,570,405 B1 * | 5/2003 | Lien .......................... 326/83 |
| 2002/0041194 A1 | 4/2002 | Onizawa et al. |
| 2002/0109525 A1 | 8/2002 | Shin |
| 2002/0113628 A1 | 8/2002 | Ajit |

OTHER PUBLICATIONS

Singh, Gajendra P, et al. "High-Tolerant I/O Buffers With Low Voltage CMOS Process," IEEE Journal of Solid-State Circuits, 1999 vol. 34, No. 11, Nov. 1999.

* cited by examiner

*Primary Examiner*—Daniel D Chang (57) ABSTRACT

An electronic device with a CMOS circuit (CC) comprises a first driver circuit (10) having a first and second PMOS transistor (P1, P2) and a first and second NMOS transistor (N1, N2). The electronic device furthermore comprise a second driver circuit (20) with a third and fourth PMOS transistor (P3, P4) and a third and fourth NMOS transistor (N3, N4). The second driver circuit (20) is complementary to the first driver circuit (10) and switches in the opposite direction to the first driver circuit (10). A gate of the second and fourth PMOS transistor (P2, P4) is coupled to a first bias voltage (REPp) and a gate of the second and fourth NMOS transistor (N2, N4) is coupled to a second bias voltage (REFn). A first capacitance (C3) is coupled between the gate and the drain of the fourth PMOS transistor (P4) and a second capacitance (C4) is coupled between the gate and the drain source of the fourth NMOS transistor (N4).

6 Claims, 11 Drawing Sheets

ELECTRONIC DEVICE AND INTEGRATED CIRCUIT

The invention relates to an electronic device and an integrated circuit.

Recently, a demand for integrated circuits with more computation power, with a greater integration density and with additional low power capabilities has increased. In order to fulfill these requirements, deep sub micron- and nanotechnologies have become more and more important for reducing the transistor geometries such that a low supply voltage is required for a sufficient life time of the electronic devices. However, CMOS integrated circuits typically need to drive or control other external devices which may require an input signal with a larger voltage magnitude. For example, an interface of an external device may operate at 3.3V while present CMOS technology can only provide for 2.5V. Therefore, novel devices must also be able to provide a 3.3V compatible output signal. On the other hand, a device may output a signal at 3.3V which needs to be interfaced to a CMOS integrated circuit such that a CMOS integrated must also be able to accept an input signal with 3.3V. In other words, novel 2.5V CMOS process integrated circuits or devices must be able to provide a 3.3V power supply. In addition, a 3.3V power supply should be interfaced to a 1.8V CMOS process or a 2.5V power supply should be interfaced with a 1.8V CMOS process. Hence, an integrated circuit is required which operates at a higher power supply voltage while using a low voltage CMOS process.

However, if a high power supply is directly applied to the low voltage MOS transistors, an overstress across transistor terminals like Vds, Vgs, Vgd may be caused. This is disadvantageous as a high voltage stress across the drain to the source may cause an overstress across the channel which may in turn cause a channel breakdown due to the hot carrier effect. Furthermore, a high voltage at the gate may cause the gate oxide to break down which in turn may lead to problems regarding the long term reliability due to a time dependent and voltage dependent breakdown of the gate oxide.

U.S. Pat. No. 5,604,449 discloses a circuit design which limits the voltage across the transistor terminal to a specified value. In particular, an output driver for high voltage operation using a low voltage CMOS process is shown. The output driver comprises a cascode of NMOS and a PMOS transistor structure in order to avoid an over voltage stress across the transistor terminals. A bias voltage is provided to control the gates of the upper NMOS and the lower PMOS of the cascoded pad driver, i.e. the inner pair of the transistors of the cascode arrangement. The control gates of the lower NMOS and the upper PMOS transistors (the outer pair) of the pad drivers are controlled by a signal from a pre-driver of the output buffer.

Figure 1A:
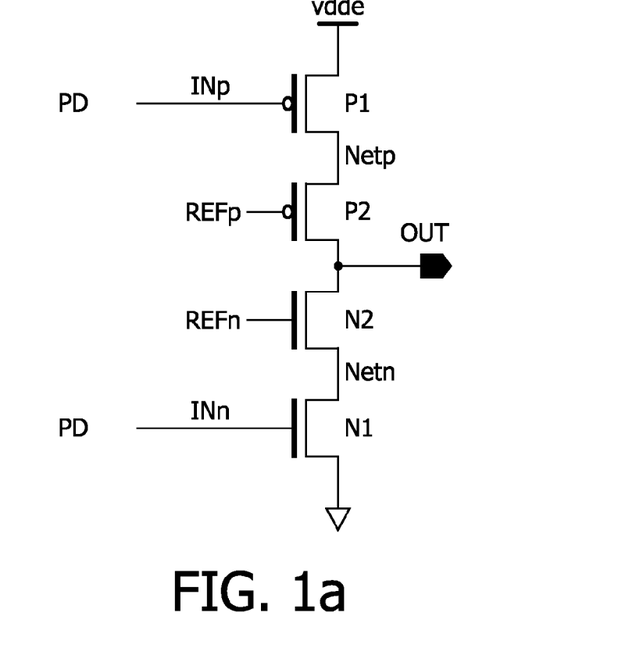
FIG. 1a shows a circuit diagram of a driver circuit according to the prior art.

FIG. 1a shows a circuit diagram of a driver circuit according to the prior art. In particular, a cascoded pad driver architecture is shown with two PMOS transistors P1, P2 and two NMOS transistors N1, N2. The pad driver is operated at a supply voltage vdde, which is larger than the nominal stress voltage of the transistors P1, P2; N1, N2 used in the pad driver. The gate of lower PMOS P2 is connected to a bias voltage REFp and the gate of upper NMOS N2 is connected to another bias voltage REFn.

Figure 1B:
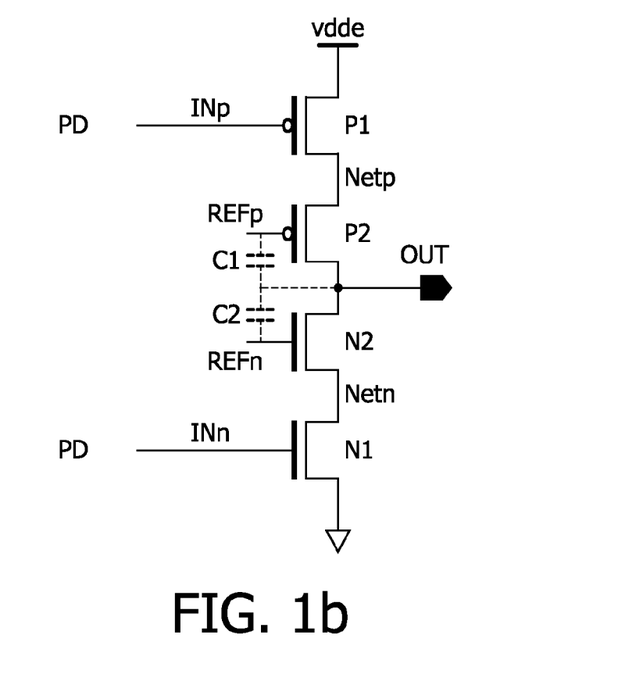
FIG. 1b shows a circuit diagram of a driver circuit according to the prior art.

FIG. 1b shows a circuit diagram of a driver circuit according to FIG. 1a with gate to drain parasitic capacitors of PMOS P2 and NMOS N2. These capacitors C1 and C2 are the device parasitic capacitors (shown in dotted lines) and cannot be avoided. As pad drivers are designed to drive high output loads, the sizes of pad driver transistor will consequently be very high. However, the higher the sizes of pad driver transistors, the higher the parasitic capacitance, which will cause a high coupling.

Figure 1C:
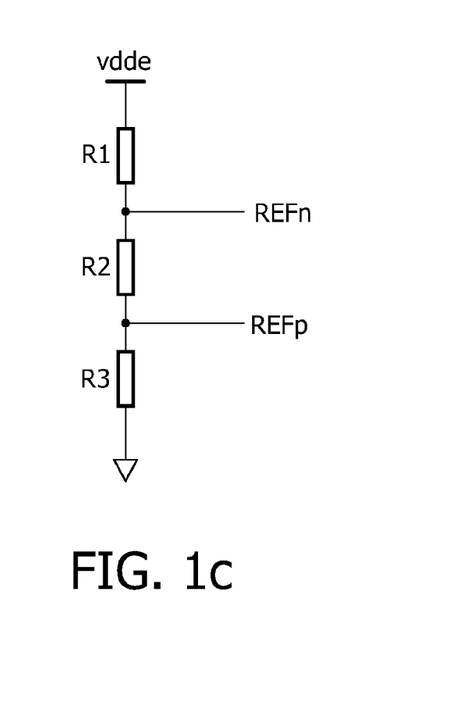
FIG. 1c shows a circuit diagram of a potential divider for the driver circuit according to FIG. 1a, FIG. 1d shows a graph of a simulation waveform of the circuit according to FIG. 1a, FIG. 1e shows a graph of a simulation waveform of the circuit according to FIG. 1a, FIG. 1f shows a graph of a simulation waveform of the voltage swing of the circuit of FIG. 1a, FIG. 2 shows a circuit diagram of a driver circuit according to a first embodiment.

FIG. 1c shows a circuit diagram of possible potential divider to generate bias voltages for the circuit according to FIG. 1a. Since the transistors used in pad driver have a lower stress voltage, they cannot tolerate the high voltage vdde stress across their terminals. If all transistors used in the driver circuit have a maximum stress of Vx across their terminals (where Vx<vdde), the bias voltages REFp and REFn are generated in such a manner that the voltages (vdde-REFp) should always be less than Vx and also REFn should always be less than Vx. The appropriate values of resistances R1, R2 and R3 are chosen to generate the appropriate bias voltages, which satisfy the above conditions. The bias voltages REFp and REFn are generated using a resistance potential divider. This potential divider can also be implemented by using MOS transistors instead of resistances. For the low power application reference generators are required to consume low static current, which makes the output impedance of these reference generators very high. If any noise or any signal switching couples to these bias voltages, the bias generator will not be able to discharge that coupling efficiently or the discharge takes very long time.

A gate of the upper PMOS P1 according to FIG. 1a and FIG. 1b is controlled by a signal INp from a pre-driver PD. A voltage swing of the INp should be from REFp to vdde so that there will be no over voltage stress across gate and source of PMOS P1. The gate of the lower NMOS N1 is controlled by a signal INn coming from the pre-driver PD. The voltage swing of the signal INn should be from 0V to REFn such that the gate to source voltage of NMOS N1 will not exceed REFn. These signals INp and INn can be generated by inverters or other circuit blocks as described in U.S. Pat. No. 5,604,449.

If the input to the output buffer according to FIG. 1a is a logic '1', the terminal INp will be at REFp and INn will be at 0V. The terminals Netp and OUT both will be at vdde, but the voltage at the terminal Netn will be (REFn−Vtn). Here, for the PMOS P1 and P2 transistor: Vds=0V, Vgs=Vgd=(REFp−vdde)

For NMOS N1: Vds=(REFn−Vtn), Vgs=0V, Vgd=−(REFn−Vtn)

For NMOS N2: Vds=vdde−(REFn−Vtn), Vgs=Vtn, Vgd=REFn−vdde

It can be observed that the across terminal voltages of all transistors are less than the maximum allowable stress voltage Vx.

If the input to the output buffer is a logic 'O', the terminal INp will be at vdde and the terminal INn will be at REFn. The terminal Netn and OUT will go to 0V while Netp will be at (REFp+Vtp). In this case For NMOS N1 and N2=Vds=0V, Vgs=Vgd=REFn For PMOS P1: Vds=(REFp+Vtp)−vdde, Vgs=0V, Vgd=−(REFp+Vtp)

For PMOS P2: Vds=−(REFp+Vtp), Vgs=−Vtp, Vgd=REFp

It can be observed that across terminal voltages of all transistors is less than the maximum allowable stress Vx.

One major source of coupling to bias voltages is the gate to drain parasitic capacitances of PMOS P2 and NMOS N2 of pad driver (driver circuit).

When the output signal OUT rises from 0V to vdde, the coupling through capacitances C1 and C2 causes a rising of the REFp and REFn from their nominal values. In order to reduce the static current, a bias generator will be selected as very weak. Such a weak bias generator will require significant time to discharge REFp and REFn to their nominal values.

Accordingly, even for a low frequency of 50 MHz, the values of REFp and REFn will almost remain at their increased value and almost no discharging through bias generator will be observed. Due to the coupling at REFp, the value of REFp is becoming higher than its nominal value and will hence slow down the driving capability of the PMOS transistor P2, and the output impedance of the driver will increase. Due to coupling at REFn, the value of REFn is becoming more than its nominal value. So, the drain voltage of NMOS transistor N1 will be higher than REFn which will cause gate to drain and drain to source overstress for NMOS N1. Similarly when the output is falling from vdde to 0V, because of the coupling through capacitances C1 and C2, REFp and REFn will come down from their nominal value. When REFp is less than its nominal value, voltage at the drain of PMOS P1 goes very close to 0V or it will be less than nominal REFp value, which causes gate to drain and drain to source over stress for PMOS P1.

When the output switching is coupled to the bias voltages, the discharging of this coupling through a high impedance bias generator will be very slow and it will require large amount of time to bring the bias voltages to their nominal value. After coupling, the bias voltages will approach to their nominal values and at different times values of bias voltages will be different causing different trip points for the buffer for pulses having different widths. This will cause the high amount of jitter in output buffer.

Figure 1D:
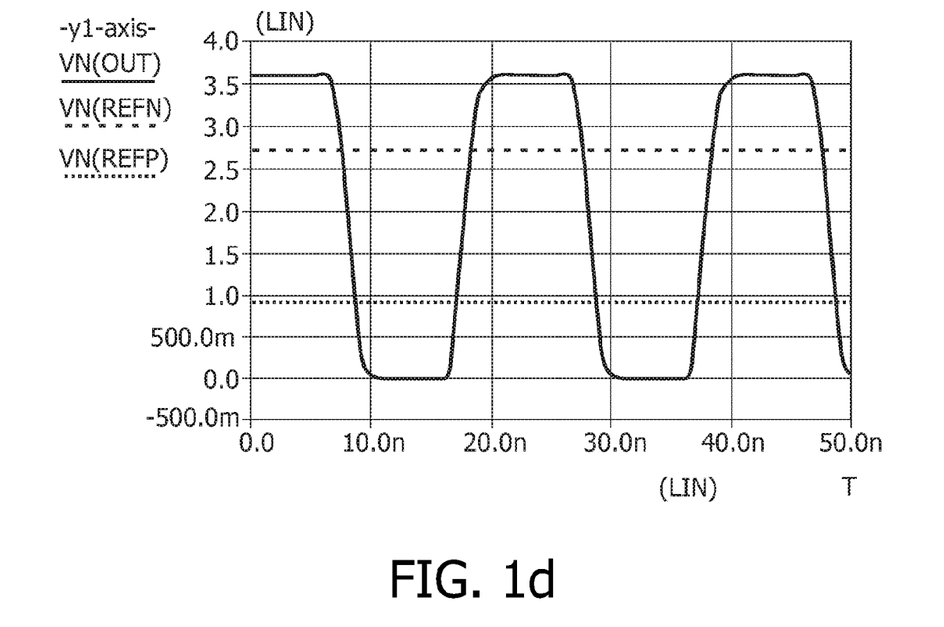

FIG. 1d shows a graph of the circuit according to FIG. 1a when both REFp and REFn are forced as perfect supplies. In particular, a simulation of the driver circuit of FIG. 1a is depicted. The simulations relate to a circuit designed in cmos090 (SOA) process having 16 mA sourcing and sinking capability, wherein the devices are 2.5V devices and maximum allowable stress across their terminal is 2.75V.

Maximum static current taken by a reference generator is less than 5.25 uA and values of reference voltages are given below:

REFp=(¼)*vdde (0.9V for 3.6V vdde)
REFn=(¾)*vdde (2.7V for 3.6V vdde)

The sizes of pad driver MOSs are: PMOS P1 and P2=380 u/0.28 u and for NMOS N1 and N2=145.6 u/0.28 u. The input signal at INp and INn is forced and the rise time and the fall time of output of pad driver is maintained at 2 ns (for nominal operating conditions).

The simulation according to FIG. 1d shows the output when there are plain reference voltages at REFp and REFn (REFp=0.9V, REFn=2.7V for 3.6V power supply). This simulation at nominal process and nominal temperature gives rise and fall time of the output around 1.9 ns.

Accordingly, this simulation shows the real coupling at bias voltages when no reverse coupling circuit is used. The simulation is performed for nominal operating condition (process: nom, temp: nom, vdde: 3.6 v) at 50 MHz frequency.

Figure 1E:
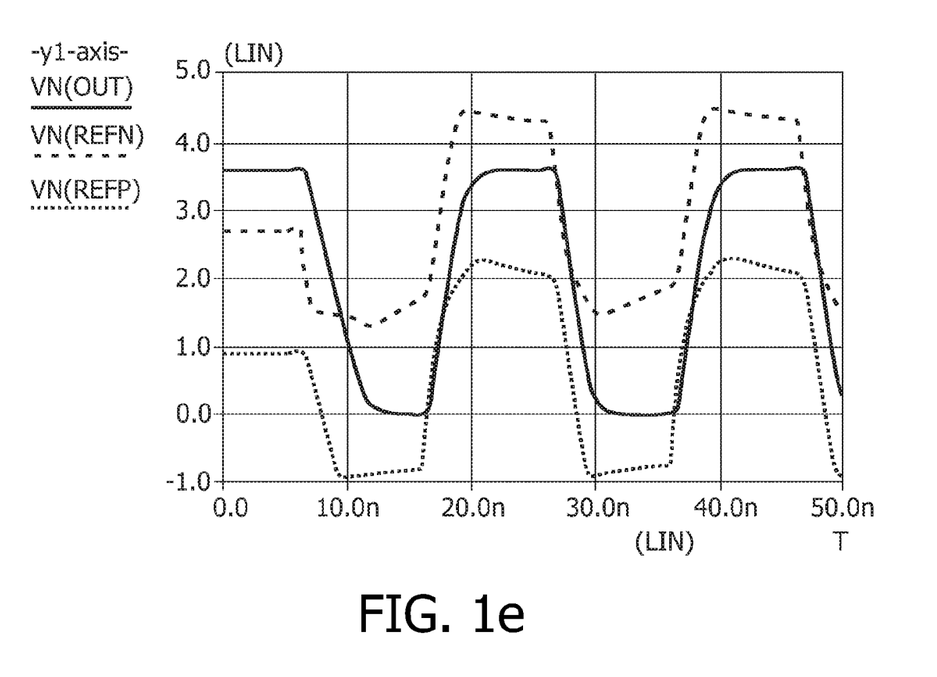

FIG. 1e shows a graph of the simulation results of the circuit according to FIG. 1a. Here, reference voltages are generated by a reference generator. This graph shows the coupling on REFp and REFn with a switching at the output OUT. When OUT is switching from high to low, both REFp and REFn are going down from their nominal value. REFn goes to 1.5V from its nominal value of 2.7V and REFp goes to around −1V from its nominal value of 0.9V. Furthermore, the reference generator is not able to quickly discharge this coupling on bias voltages.

Figure 1F:
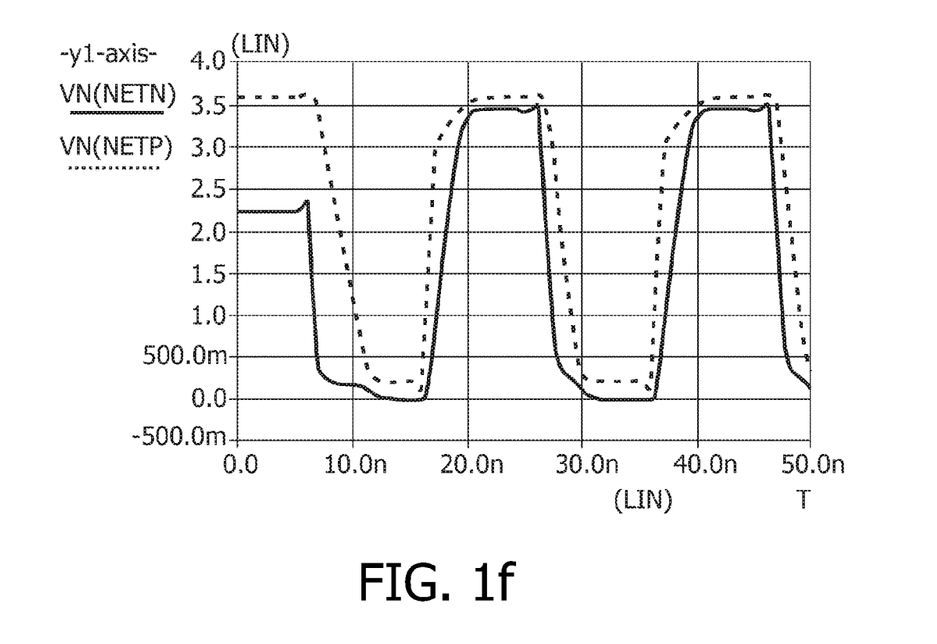

FIG. 1f shows a graph of a simulation of the voltage swing at Netp and Netn of the circuit according to FIG. 1a. Due to high coupling on bias voltages, Netp and Netn are swinging from 0V to vdde causing over voltage stress for PMOS P1 and NMOS N1.

Therefore, the coupling to the bias voltages appears the main issue of the circuit of FIG. 1a, 1b. To discharge the coupling at a fast rate, a low impedance bias generator is required. However, such a low impedance bias generator will have high static current. Applications like mobile phones cannot allow high static current. Although the circuit explained above will not have any over voltage stress problem, such a topology has the major disadvantage of coupling to the bias voltages.

It is an object of the invention to provide an electronic device with a CMOS circuit which can minimize a high coupling on the bias voltage without increasing the static current significantly.

This object is solved by an electronic device according to claim 1.

Therefore, an electronic device with a CMOS circuit is provided. The electronic device comprises a first driver circuit having a first and second PMOS transistor and a first and second NMOS transistor. The first driver circuit is coupled between a first voltage and ground. The driver circuit is also coupled to the CMOS circuit. The electronic device furthermore comprise a second driver circuit with a third and fourth PMOS transistor and a third and fourth NMOS transistor. The second driver circuit is coupled between the first voltage and ground. The second driver circuit is complementary to the first driver circuit and switches in the opposite direction to the first driver circuit. A gate of the second and fourth PMOS transistor is coupled to a first bias voltage and a gate of the second and fourth NMOS transistor is coupled to a second bias voltage. A first capacitance is coupled between the gate and the drain of the fourth PMOS transistor and a second capacitance is coupled between the gate and the source of the fourth NMOS transistor.

Accordingly, an electronic device with a CMOS circuit and corresponding driver circuits are provided which enables a low static current while decoupling the bias voltages. Therefore, such an electronic device can also be implemented in a mobile device.

According to an aspect of the invention, the size of the second driver circuit is smaller than the size of the first driver circuit. Therefore, less area is required to implement the first and second driver circuits.

According to a preferred aspect of the invention, the electronic device comprises a PMOS pre-driver circuit which is coupled to the gate of the first PMOS transistor. The electronic device furthermore comprises a NMOS pre-driver circuit which is coupled to the gate of the first NMOS transistor. The gate of the third PMOS transistor is coupled to the PMOS pre-driver circuit or is coupled to the drain of the first PMOS transistor. The gate of the third NMOS transistor is coupled to the NMOS pre-driver circuit or is coupled to the drain of the first NMOS transistor.

According to a further aspect of the invention, a third capacitance is coupled between the gate of the second PMOS transistor and ground and a fourth capacitance is coupled between the gate of the second NMOS transistor and ground.

The invention also relates to an integrated circuit having a CMOS circuit. The integrated circuit comprises a first driver circuit having a first and second PMOS transistor and a first and second NMOS transistor. The first driver circuit is coupled between a first voltage and ground. The driver circuit is also coupled to the CMOS circuit. The integrated circuit furthermore comprise a second driver circuit with a third and fourth PMOS transistor and a third and fourth NMOS transistor. The second driver circuit is coupled between the first voltage and ground. The second driver circuit is complementary to the first driver circuit and switches in the opposite direction to the first driver circuit. A gate of the second and fourth PMOS transistor is coupled to a first bias voltage and a gate of the second and fourth NMOS transistor is coupled to a second bias voltage. A first capacitance is coupled between the gate and the drain of the fourth PMOS transistor and a second capacitance is coupled between the gate and the source of the fourth NMOS transistor.

Further aspects of the invention are subject to the dependent claims.

The invention relates to the idea to minimize the high coupling on bias voltages without any increment in static current within (an output buffer of) a CMOS circuit. The concept of reverse coupling is used to achieve this. For reverse coupling a complementary driver circuit or a pad driver is used which is switching in opposite direction of a main driver circuit or a pad driver. To save the layout area, the size of the complementary pad driver is kept less than the size of main pad driver. Additional (miller) capacitors can be added between the gate and the drain of the bias voltage connected MOSs of complementary pad driver to compensate the reduction in parasitic gate to drain capacitors due to reduction in MOS size. During switching, a coupling to bias voltages due to gate to drain parasitic capacitors of main pad driver MOSs, is decoupled by the complementary pad driver switching in opposite direction. A decoupling by the complementary pad driver is provided by the combined effect of gate to drain parasitic capacitors and additional miller capacitors. The complementary pad driver is controlled by the output of main pad driver so that the complementary pad driver can sense the output slew rate of main pad driver. If output slew rate of complementary pad driver will be controlled by the output slew rate of main pad driver, amount of coupling due to main pad driver will be same as the amount of decoupling by complementary pad driver for all loading conditions and for all operating conditions.

The embodiments and the advantages of the invention will now be described with respect to the drawings.

Figure 2:
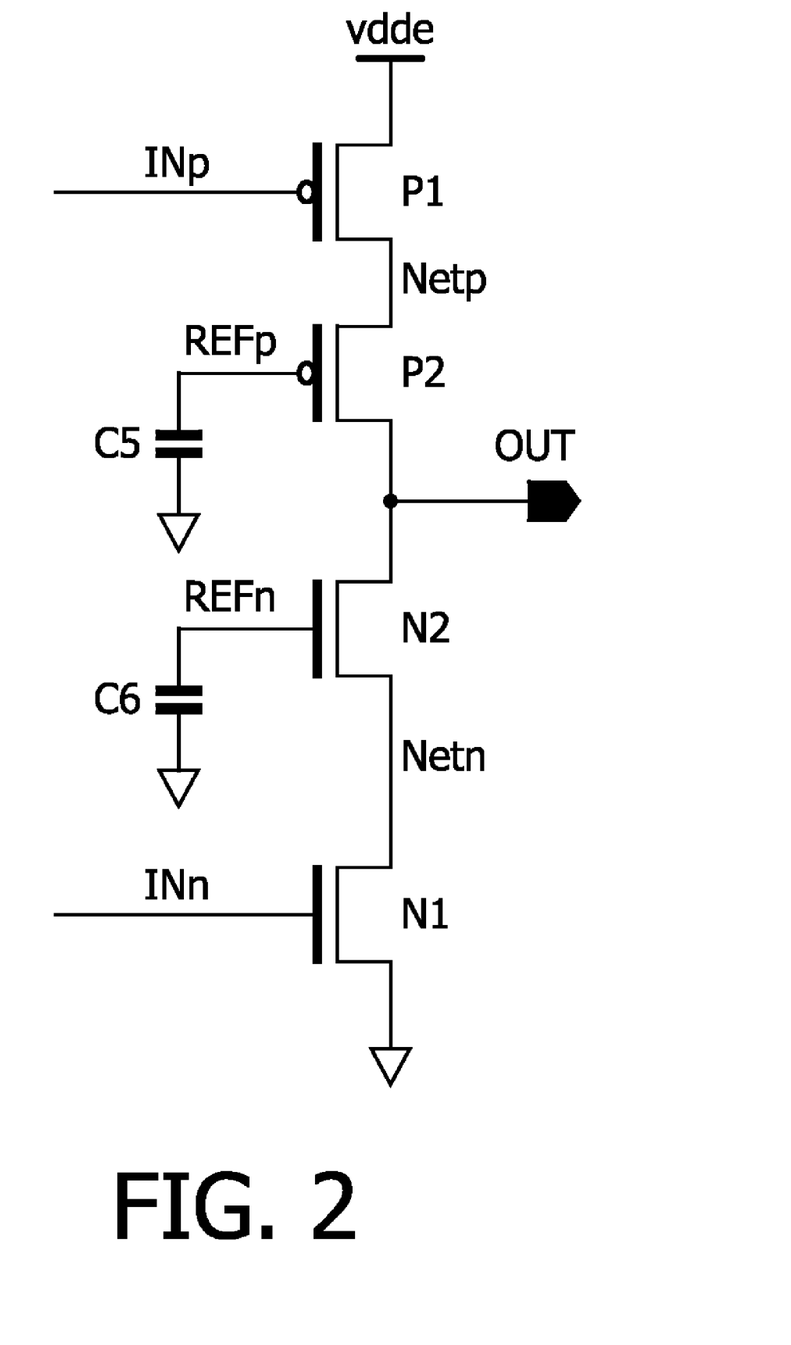

FIG. 2 shows a circuit diagram of a driver circuit according to a first embodiment. The driver circuit or the pad driver according to the first embodiment substantially corresponds to the pad driver according to FIG. 1a but comprises two additional decoupling capacitors. Therefore, a first and second PMOS transistor P1, P2 is coupled to a first and second NMOS transistor N1, N2. The first PMOS transistor P1 receives an input INp and the first NMOS transistor receives an input INn. In addition, a first decoupling capacitor C5 is connected between REFp and ground and a second decoupling capacitor C6 is connected between REFn and ground. These capacitors C5, C6 should be arranged near the gates of pad driver transistors P2, N2 to reduce routing resistance. Furthermore, these capacitors C5, C6 near the gates of P2 and N2 provide a discharge path to any coupling at REFp and REFn. Accordingly, the bias voltages are decoupled by placing decoupling capacitors at the terminals REFp and REFn.

However, the disadvantage of this method is that it requires large capacitors which occupy large area which may violate the area constraint.

Figure 3:
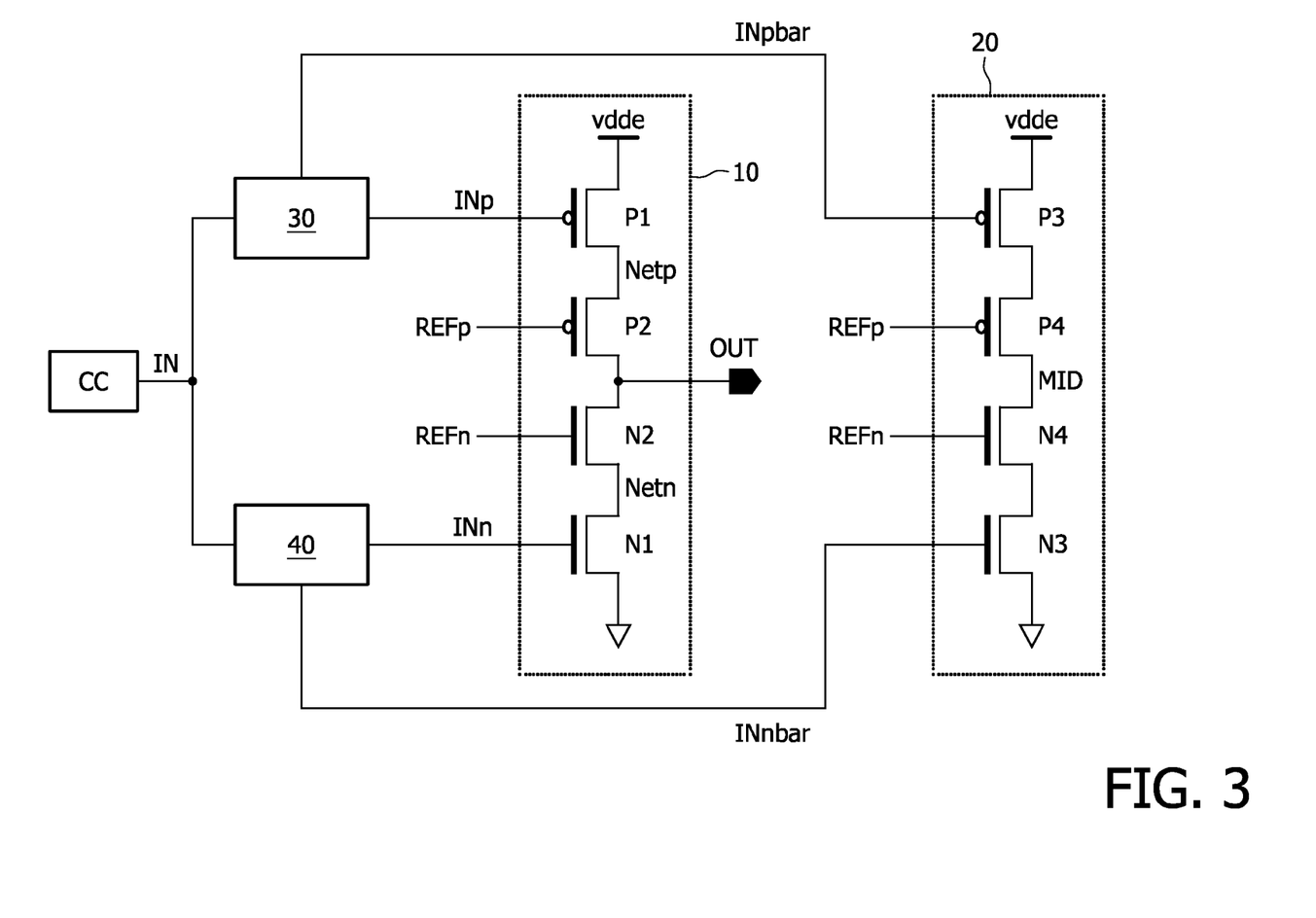
FIG. 3 shows a circuit diagram of a driver circuit according to the second embodiment.

FIG. 3 shows a circuit diagram of a driver circuit according to the second embodiment. The driver circuit comprises a PMOS pre-driver 30 and a NMOS pre-driver 40 which can both be coupled to a CMOS circuit CC via the node IN. Here, the PMOS pre-driver 30 generates two complementary outputs INp and INpbar. The slew rate of these two signals are controlled to control or adjust the output slew rate of the main and complementary pad driver. The NMOS pre-driver 40 generates two complementary signals INn and INnbar. The slew rates of INn and INnbar are controlled as well to control the output slew rate of main and complementary pad driver.

The circuit 10 constitutes the main pad driver similar to that according to FIG. 1a. The two reference voltages REFp and REFn can be generated in the same manner as shown in FIG. 1c. The circuit 20 constitutes a complementary pad driver. This complementary pad driver comprises PMOS P3 and P4. The gate of the transistor P3 is controlled by a signal INpbar from the pre-driver 30. The gate of the transistor P4 is connected to bias voltage REFp also used in main pad driver. The complementary pad driver 20 comprises two NMOS transistors N3 and N4. The gate of transistor N3 is controlled by the signal INnbar from pre-driver 40. The gate of transistor N4 is connected to REFp also used in the main pad driver. The size of all transistors of complementary pad driver is same as the sizes of main pad driver transistors so that the parasitic gate to drain capacitances of transistors P2 and N2 of main pad driver will be equal to the gate to drain parasitic capacitance of transistors P4 and N4 of complementary pad driver. Since the main pad driver and the complementary pad driver are switching in opposite direction, coupling provided by the main pad driver will be overcome by the decoupling provided by the complementary pad driver.

However, the disadvantages of this circuit is that it requires large area for the complementary pad driver, also to switch complementary pad driver in opposite direction a separate pre-driver is required. Since the main pad driver is driving external load but complementary pad driver is not aware of this external load and any variation in external load will change the output slew rate of the main pad driver and hence change the amount of coupling. As the complementary pad driver is not sensing any output load, it will provide a constant amount of decoupling irrespective of the output slew rate (or output load) of the main pad driver. Therefore, in such cases the amount of coupling and decoupling will not be same. Along with this disadvantage, area constraint is also restricting to use this circuit.

Figure 4:
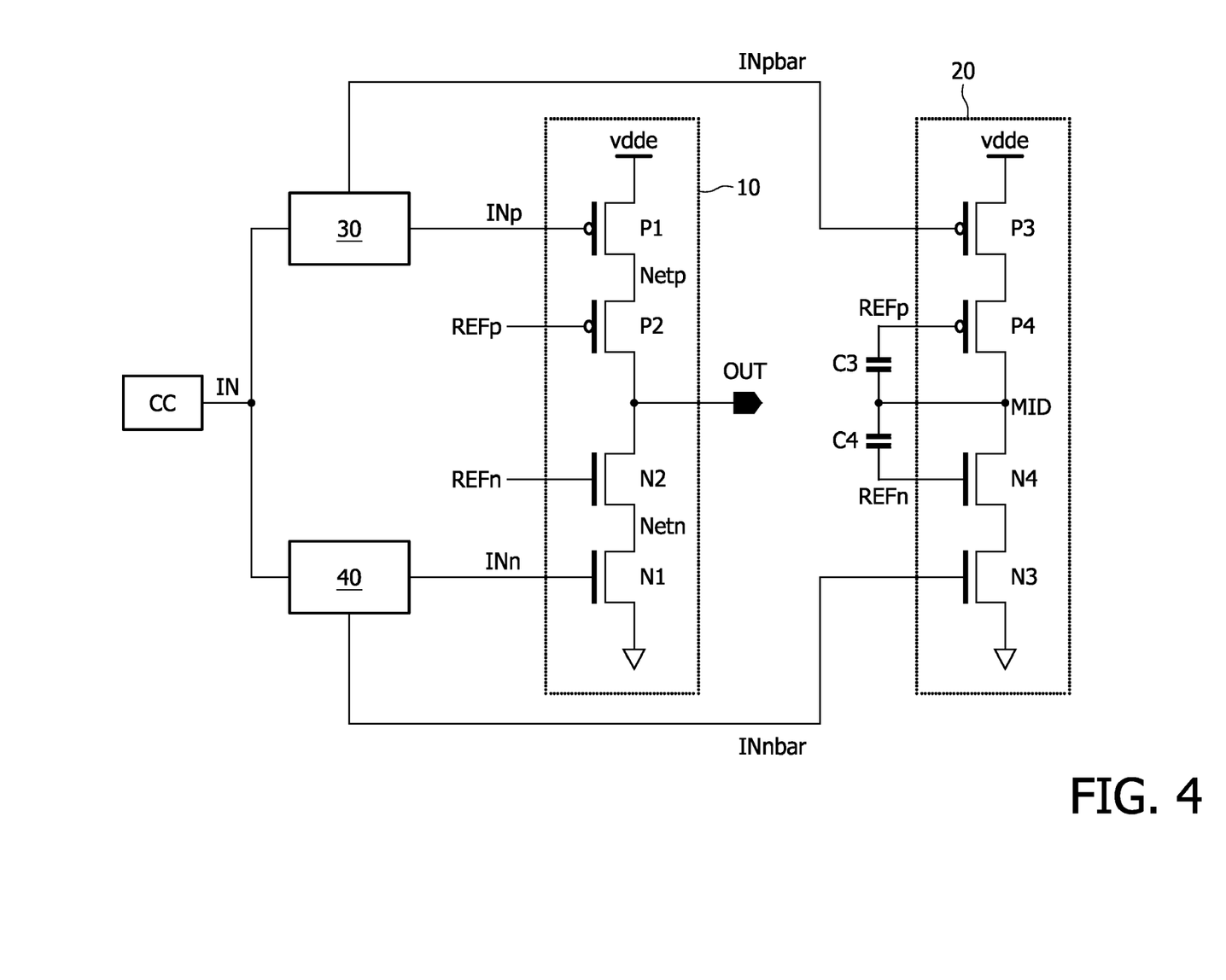
FIG. 4 shows a circuit diagram of a driver circuit according to the third embodiment.

FIG. 4 shows a circuit diagram of a driver circuit according to a third embodiment. The pad driver according to the third embodiment substantially corresponds to the pad driver according to the second embodiment. The only difference of the circuit of FIG. 4 with respect to the circuit of FIG. 3 is the size of the complementary pad drivers and of the miller capacitors C3 and C4. To save the area, transistor sizes of complementary pad driver are reduced (for example size of complementary pad driver is kept $\frac{1}{10}$ of the size of main pad driver). Because of the reduction in size of transistors, gate to drain capacitance of PMOS transistor P4 and NMOS transistor N4 will also reduce and it will not be able to provide the amount of decoupling equal to the amount of coupling provided by main pad driver. To compensate the reduced value of gate to drain capacitances of transistors P4 and N4, miller capacitors C3 and C4 are used as shown in FIG. 4. The capacitor C3 is used between the gate and drain of PMOS P4 and the capacitor C4 is used between the gate and drain of NMOS N4. The values of these capacitors are chosen such that the amount of coupling provided by main pad driver will become equal to the amount of decoupling provided by complementary pad driver.

This circuit relates to the idea to use a complementary pad driver with a reduced size and with an extra miller capacitor between the gate and the drain of a bias control transistor. The usage of an extra miller capacitor to compensate the gate drain capacitance of complementary pad drivers will lead to a reduced size of the pad driver if complimentary pad drivers are used.

Although this circuit reduces the area occupied by complementary pad driver, the main disadvantage of this circuit is that complementary pad driver cannot sense the value of output load. If the output slew rate of main pad driver changes with output load, the amount of coupling will also change but the amount of decoupling provided by complementary pad driver will remain same as its previous value and due to the difference in coupling amount and decoupling amount voltage values of bias voltages will shift from their nominal values. One another disadvantage is that it requires a separate pre-driver to drive the complementary pad driver. It will therefore be very difficult to match the output slew rate of the main and complementary pad driver for all operating conditions, hence there will be a difference in the amount of coupling and decoupling.

Figure 5A:
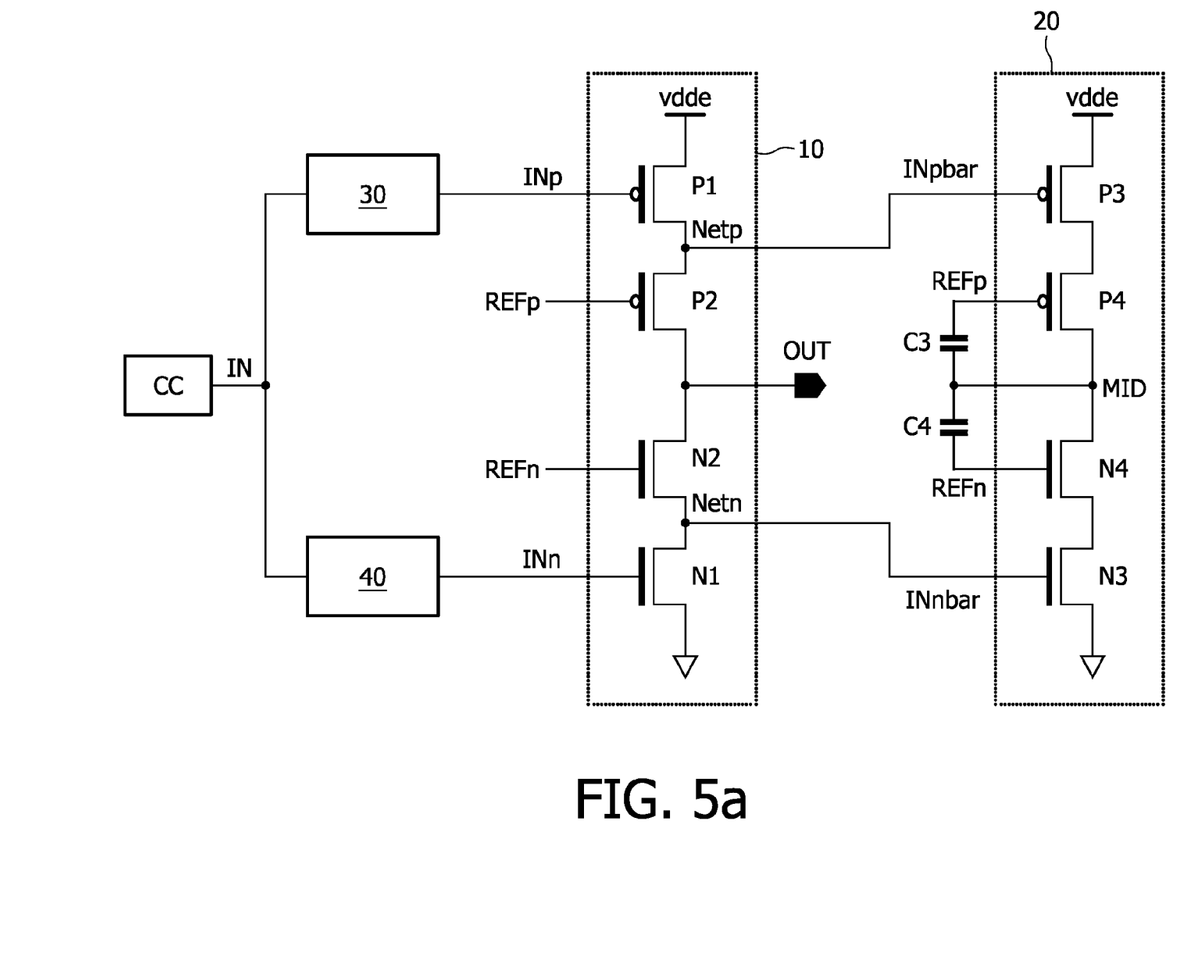
FIG. 5a shows a circuit diagram of a driver circuit according to the third embodiment.

FIG. 5a shows a circuit diagram of a pad driver according to the fourth embodiment. This circuit relates to the idea to use a reduced size complementary pad driver which can be controlled by a main pad driver and which comprises an extra miller capacitor between the gate and the drain of the bias control transistors. While the circuit according to FIG. 4 has reduced the area required for the complementary pad driver, such a circuit is disadvantageous as it will not be able to sense the output load of the main pad driver. Due to the main pad driver the decoupling provided by the complementary pad driver will be different from the amount of coupling provided by the main pad driver for different loading conditions and for different operating conditions. The circuit according to FIG. 5a is similar to the circuit according to FIG. 4 with only difference is that INpbar and INnbar are not generated by a pre-driver but are the output of main pad driver 10.

The PMOS pad driver 30 generates a signal INp for the PMOS transistor P1 of the main pad driver 10. As mentioned above, the voltage swing of INp should be from REFp to vdde. This swing at INp can be easily generated by using the inverter (or NAND, NOR gates) as described in U.S. Pat. No. 5,604,449 which is incorporated herein by reference. The slew rate of signal INp is controlled to control the output slew rate of main pad driver as per specifications. The NMOS pre driver 40 generates the signal INn to control the NMOS transistor N1 of main pad driver 10.

The voltage swing of signal INn should be from 0V to REFn. The slew rate of the signal INn should be controlled to output a controlled slew rate output of main pad driver 10 as per specification. The main pad driver circuit 10 comprises two PMOS transistors P1 and P2 and two NMOS transistors N1 and N2. The gate of P1 is controlled by the signal INp coming from PMOS pre driver 30. The gate of PMOS transistor P2 is controlled by bias voltage REFp. The bias voltage corresponds to the voltage generated by the bias generator of FIG. 1c. The upper PMOS transistor P1 is connected between supply voltage vdde and the node Netp. The PMOS transistor P2 is connected between node Netp and output of pad driver OUT. The pad driver 10 of FIG. 5a comprises two transistors NMOS N1 and N2. The gate of N1 is controlled by signal INn coming from NMOS pre driver 40. The gate of transistor NMOS N2 is controlled by bias voltage REFn, corresponding to the bias voltage generated by bias generator of FIG. 1c. The NMOS transistor N1 is connected between ground and node Netn. The transistor NMOS N2 is connected between node Netn and output of main pad driver OUT. The complementary pad driver 20 comprises two transistors PMOS P3 and P4 and two NMOS transistors N3 and N4. The gate of PMOS transistor P3 is controlled by the signal INpbar. INpbar is connected to node Netp of main pad driver 10. The source of transistor P3 is connected to vdde and its drain is connected to the source of the PMOS transistor P4. The gate of transistor P4 is controlled by bias voltage REFp (which is also controlling the gate of PMOS P2 of main pad driver). The source of transistor P4 is connected to the drain of PMOS transistor P3 and drain of transistor P4 is connected to the intermediate node MID. The gate NMOS transistor N3 of complementary pad driver 20 is controlled by a signal INnbar. INnbar is connected to node Netn of main pad driver 10. The source of transistor N3 is connected to ground and its drain is connected to the source of NMOS N4. The gate of NMOS transistor N4 is controlled by bias voltage REFn (which is also controlling the gate of N2 of main pad driver). The source of transistor N4 is connected to the drain of transistor N3 and its drain is connected to an intermediate node MID. The capacitor C3 is connected between gate and drain of PMOS P4 and capacitor C4 is connected between gate and drain of NMOS transistor N4.

A cascoded architecture for main and complementary pad driver is used to limit the voltage stress across the transistors. The voltage swing of Netp will be from (REFp+Vtp) to vdde, so the PMOS transistor P3 of complementary pad driver 20 will not face any over voltage stress. Similarly voltage swing of INnbar will be from 0V to (REFn−Vtn), NMOS transistor N3 will not face any over voltage stress problem.

The sizes of transistors of the complementary pad driver are smaller than the sizes of the transistors of main pad driver. E.g. the area of complementary pad driver transistors is $\frac{1}{10}$th of the area of main pad driver transistors. Here the area of a transistor mainly indicates the width of that transistor. So width of all PMOS transistors of complementary pad driver (P3 and P4) will be $\frac{1}{10}^{th}$ of the width of main pad driver PMOS transistors (P1 and P2). Width of all NMOS transistors of complementary pad driver (N3 and N4) will be $\frac{1}{10}^{th}$ of the width of main pad driver NMOS transistors (N1 and N2). Since the width of PMOS transistor P2 of main pad driver is more than the width of PMOS transistor P4 of complementary pad driver, the gate to drain parasitic capacitance of transistor P2 will be more than that of transistor P4. To compensate this capacitance a miller capacitor C3 is connected between gate and drain of PMOS transistor P4. Similarly to compensate the gate to drain parasitic capacitor of NMOS transistor N2, a miller capacitor C4 is connected between gate and drain of NMOS transistor N4.

Due to the switching in the input signal IN of output buffer of FIG. 5a, the output OUT of the output buffer will also switch. If the output of output buffer (i.e. output of main pad driver), is switching from logic '0' to logic '1', voltage at OUT will rise from 0V to vdde. This switching at OUT couples to the weak bias voltages REFp and REFn. Because of this coupling voltage values of REFp and REFn will exceed their nominal value and since the bias generator is very weak (to reduce static power consumption), coupling at bias voltages will not able to discharge at faster rate. When OUT is switching from 0V to vdde, Netp is also switches from (REFp+Vtp) to vdde and Netn switches from 0V to (REFn−Vtn). This switching of Netp and Netn turns off transistor P3 and turns on transistor N3. Therefore, the voltage at node MID starts falling from vdde to 0V causing a coupling at REFp and REFn in opposite direction. A decoupling provided by the gate to drain parasitic capacitance of transistor P4 along with miller capacitor C3 should be equal to the coupling provided by gate to drain parasitic capacitance of PMOS transistor P2 of main pad driver. In the same manner decoupling provided by the gate to drain capacitance of transistor N4 along with miller capacitance C4 should be equal to the coupling provided by the gate to drain parasitic capacitance of NMOS transistor N2 of main pad driver. So the amount of coupling at REFp in positive direction by main pad driver will be equal to the amount of reverse coupling (or decoupling) at REFn by complementary pad driver. When output of main pad driver switches from 0V to vdde, coupling at bias voltages due to main pad driver is decoupled by the complementary pad driver.

Now consider the case when the output OUT of main pad driver is switching from vdde to 0V, the node MID of complementary pad driver switches from 0V to vdde, so the amount of coupling at bias voltages by main pad driver will be compensated by the complementary pad driver.

As compared to the circuit of FIG. 4 where complementary pad driver is controlled by the signals generated by pre driver, here complementary pad driver is controlled by the output of main pad driver. If the slew rate of output OUT of main pad driver changes due to change in operating condition, complementary pad driver can sense this change. The amount of decoupling provided by the complementary pad driver depends on the amount of coupling in main pad driver. If output slew rate of main pad driver changes due to the change in external load, complementary pad driver will sense this change and provide appropriate decoupling.

Figure 5B:
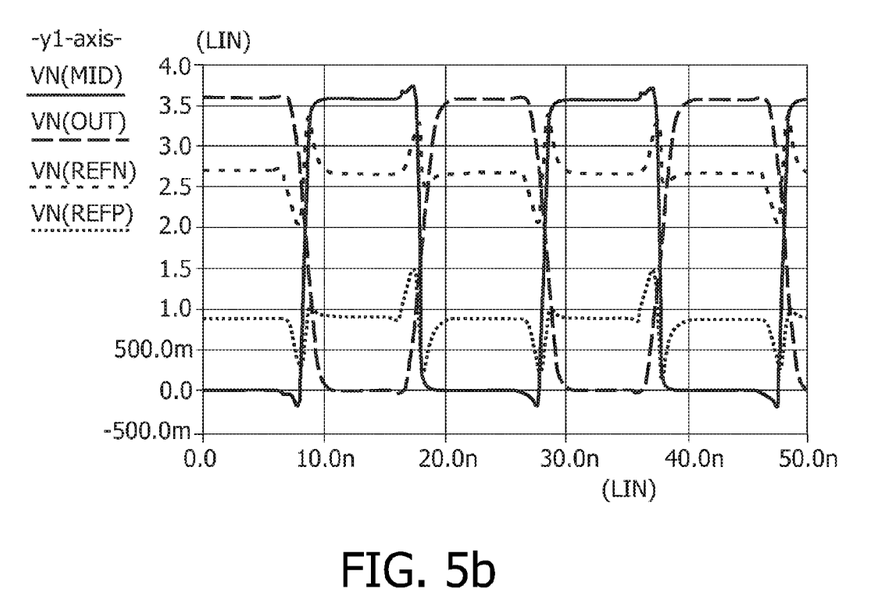
FIG. 5b shows a graph of a voltage swing of the circuit of FIG. 5a, FIG. 6a shows a circuit diagram of a driver circuit according to the fourth embodiment.

FIG. 5b shows a graph of simulation results of the circuit of FIG. 5a. Here, the simulation results of REFp and REFn are shown and waveforms of OUT and MID with REFp and REFn are shown. This simulation is performed for nominal process, 25 C and 3.6V vdde. In this diagram, the coupling provided by main pad driver is completely decoupled by the complementary pad driver. The complementary pad driver with miller capacitors C3 and C4 of FIG. 5a has the area half of the area of main pad driver.

The size of circuit components are given below:
PMOS P1 and P2=380 u/0.28 u
NM4S N1 and N2=145.6 u/0.28 u
PMOS P3 and P4=38 u/0.28 u
NMOS N3 and N4=14.5 u/0.28 u C3: two back to back connected PMOSs of 258 fF each
C4: two back to back connected PMOSs of 95 fF each At the time of switching short time spikes originate at REFp and REFn. The jitter caused by short time spikes on the bias voltages will limit the maximum bit rate of the output driver. When the OUT switches from high to low (or low to high), REFp and REFn take around 3 ns time to settle to its nominal value. This will limit the maximum bit rate of around 334 Mbps. Based on the application and operating conditions the maximum bit rate will have to be recalculated.

Figure 6A:
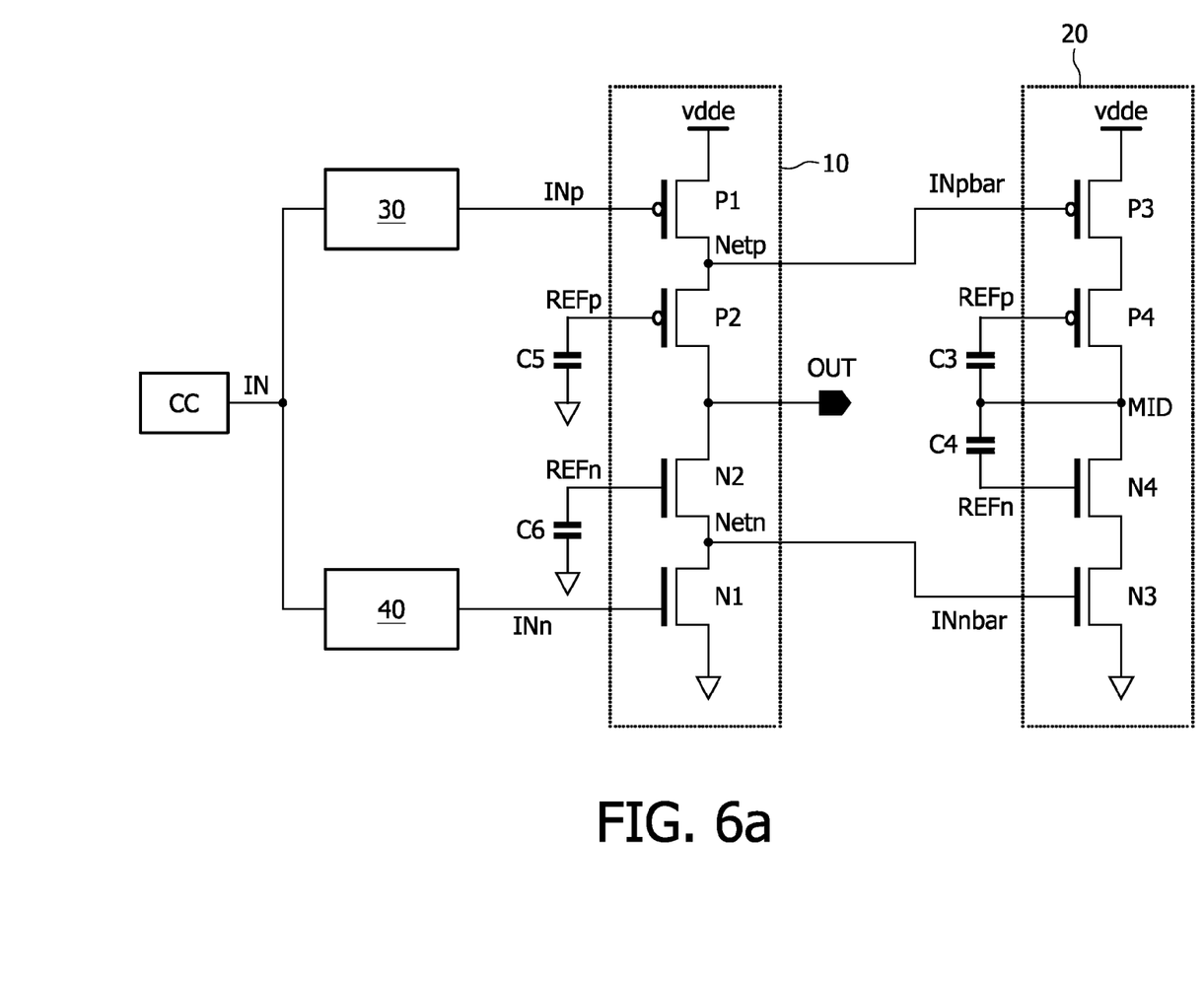

FIG. 6a shows a circuit diagram of a driver circuit according to the fifth embodiment. Here, complementary pad driver 20 is controlled by the output of main pad driver 10, such that there will be some delay between time of coupling by main pad driver and time of reverse coupling by complementary pad driver. The circuit according to FIG. 6a corresponds to the circuit according to FIG. 5a. The only difference is that decoupling capacitors C5 and C6 are connected at REFp and REFn respectively. Reverse coupling will occur after some delay of coupling. Due to this small delay there will be some short time spikes at bias voltages. These short time spikes can be suppressed by adding some capacitors at REFp and REFn. Since these decoupling capacitors to ground at REFp and REFn are used to suppress short time spikes, value of these capacitors will be very small as compared to the above-mentioned capacitor value. These small value-decoupling capacitors at REFp and REFn will also help to discharge any noise that couples to these bias voltages from any other source Some amount of noise may couple to bias voltages due to the switching happening in adjacent routing lines.

Figure 6B:
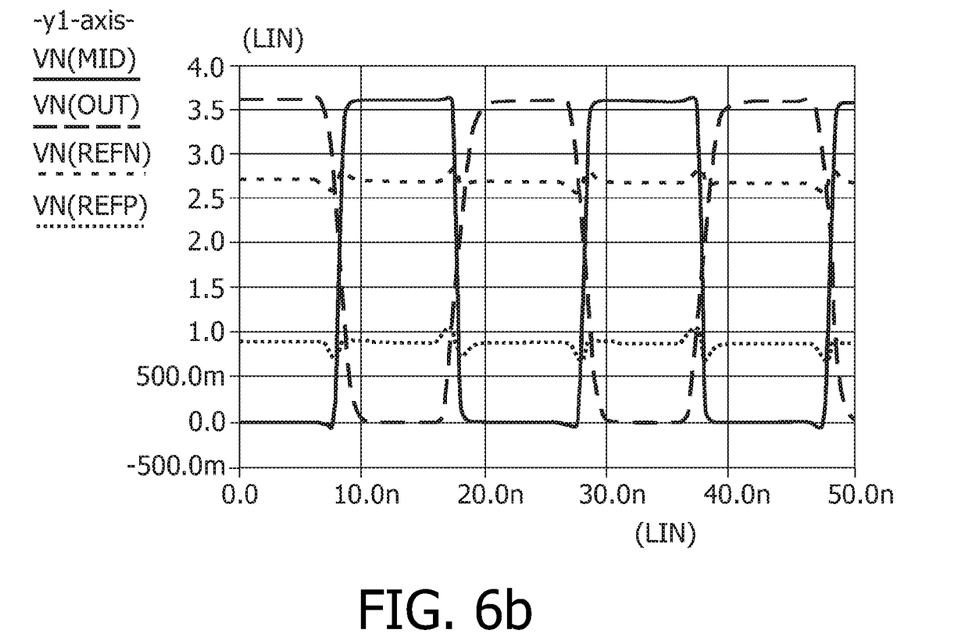
FIG. 6b shows a diagram of the voltage swing of FIG. 6a, FIG. 6c shows a graph of the voltage swing of the circuit of FIG. 6a, and FIG. 6d shows a graph of a voltage swing of the circuit of FIG. 6d.

FIG. 6b shows a graph of a simulation of the circuit according to FIG. 6a. While according to FIG. 5b, the coupling at REFp and REFn is decoupled by a complementary pad driver, decoupling capacitors are used according to FIG. 6a to reduce the short time from REFp, REFn which occur during switching. The capacitor CS and C6 are connected to decouple the short time spikes at bias voltages. The use of decoupling capacitor will increase the bit rate of the output buffer and also reduce the peaks of coupling.

The difference in FIG. 5a and FIG. 6a schematics is the provision of only decoupling capacitors (C5=2.3 pF; C6=1.3 pF).

When circuit of FIG. 2 is simulated, decoupling capacitors required for REFp and REFn were very high. In this case C5 was 32 pf and C6 was 14 pf. Accordingly, the circuit of FIG. 2 requires total capacitance of around 46 pF. But the area occupied by complementary pad driver with miller capacitors C3 and C4 and decoupling capacitors C5 and C6 will be equivalent to the area required by a 5 pF capacitor. So as compared the implementation to FIG. 2 implementation, the implementation according to FIG. 6a takes ⅑th of the area. As the circuit of FIG. 6a is able to suppress short time spikes at REFp and REFn, it can be used for higher bit rates.

Figure 6C:
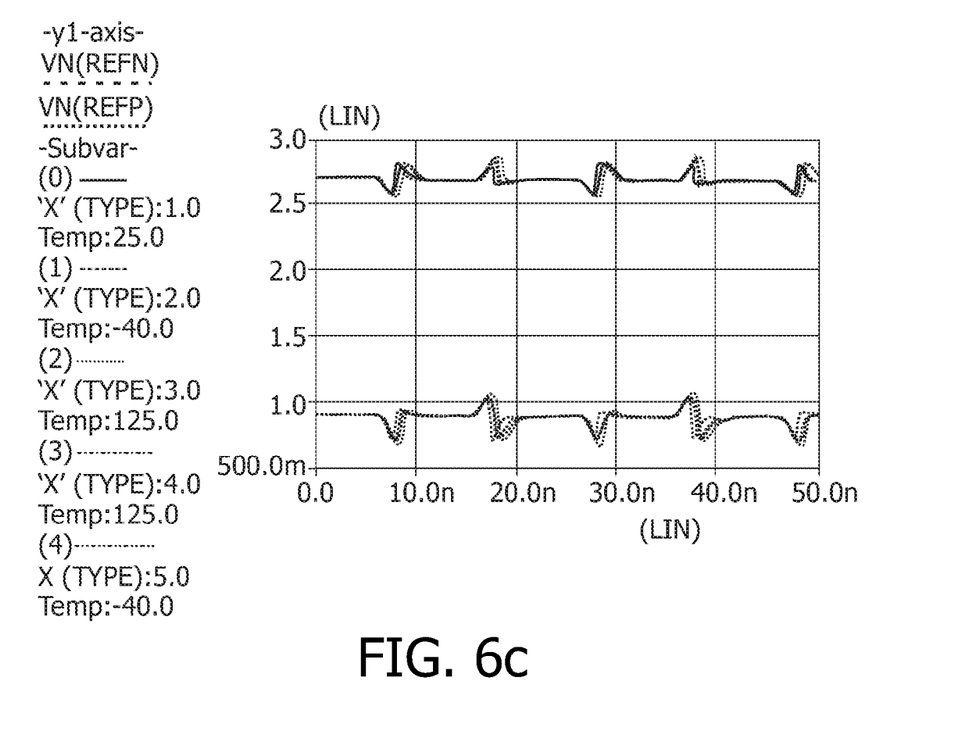

FIG. 6c shows a graph of a simulation of the circuit according to 6a. Here, the REFn and REFp results of FIG. 6 are shown for different operating conditions. These operating conditions are:
Process: nom; temp: 25 C; vdde: 3.6V
Process: fast; temp: −40 C; vdde: 3.6V
Process: slow; temp: 125 C; vdde: 3.6V
Process: snfp; temp: 1250; vdde: 3.6V
Process: fnsp; temp: −40 C; vdde: 3.6V For all above simulations vdde is taken 3.6V only, so that the variation on REFp and REFn can be observed because REFp and REFn are vdde dependent.

The main aim of waveform of FIG. 6c is to show that for different operating conditions, slew rate of OUT and MID are varying. Also the capacitance provided by C1 and C2 are varying. But since the output OUT is controlling the slew rate of MID, amount of coupling provided by main pad driver is same as the amount of decoupling provided by the complementary pad driver. This can be seen in waveform of FIG. 6c that for all operating conditions, REFp and REFn comes to its nominal value after some time of the switching.

Figure 6D:
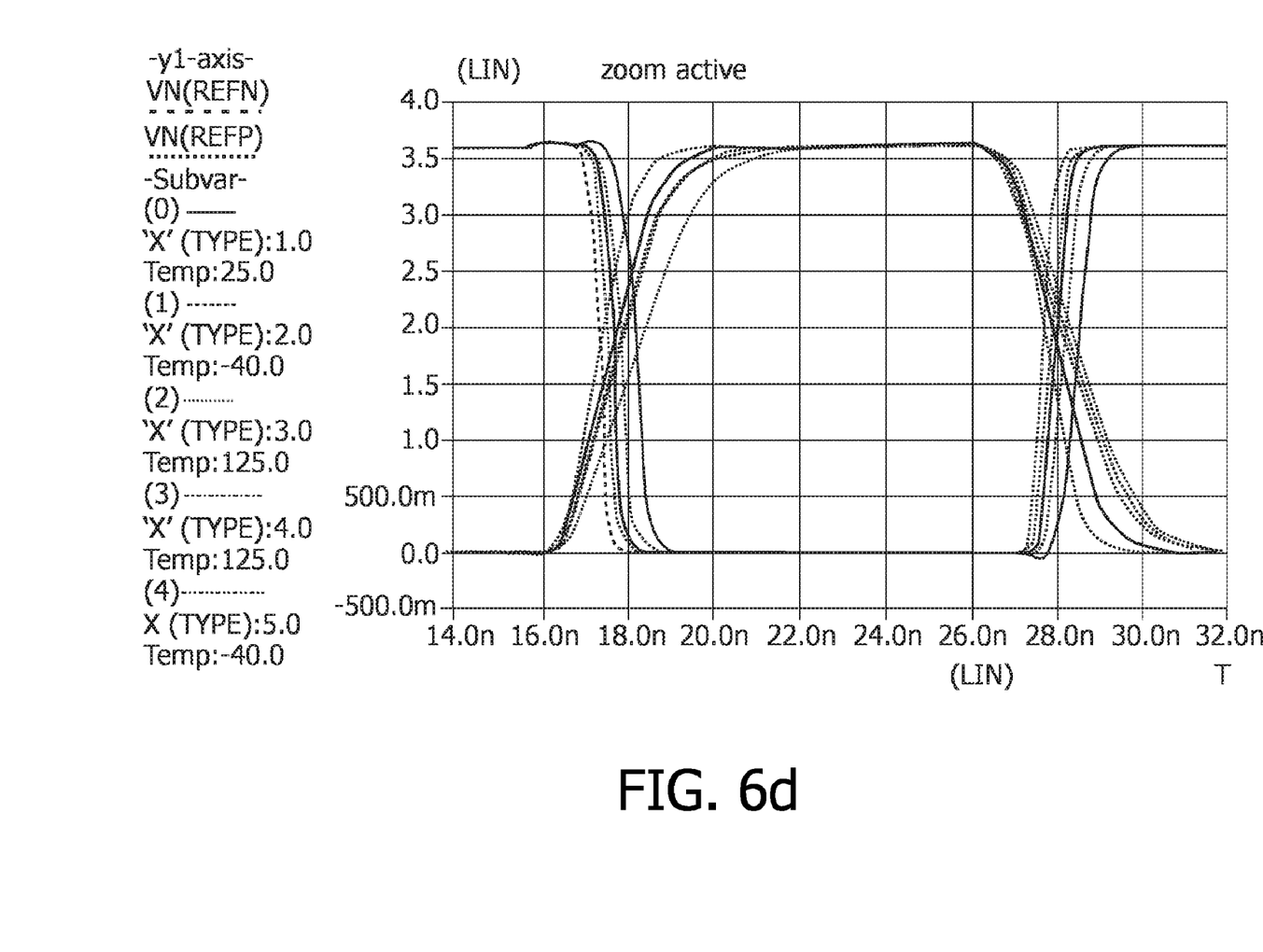

FIG. 6d shows a graph of a simulation of the circuit according to FIG. 6a. Here, the simulation results of OUT and MID for above said operating conditions are depicted. This waveform shows how the OUT and MID are varying with each other with different operating conditions. It is clear that when slew rate of OUT decreases, slew rate of MID decreases, because OUT is controlling the slew rate of MID. This feature constitutes of the advantages of the present invention. Because of this property, for all operating conditions amount of coupling provided by the main pad driver will be the same as the amount of decoupling provided by the complementary pad driver.

The circuit as explained above eliminates the problems caused by coupling on the bias voltages by using the reverse coupling technique.

This circuit can be used for designing transmitters operating on higher supply voltage using low voltage devices with very low static current consumption. Since low static current circuits are required in many applications, like mobile phones, this topology of circuit designing can be very useful.

The present trend on CMOS processes clearly shows the shrinking of device geometries, which results in a lower stress voltage limits. However the application or product market is not shrinking the supply voltages at the same rate due to compatibility problems. Thus the requirement for designing high voltage circuits with low voltage devices is only going to go up in the future.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. Electronic device, comprising:
a CMOS circuit (CC);
a first driver circuit having a first and second PMOS transistor and a first and second NMOS transistor coupled between a first voltage (vdde) and ground, wherein the first driver circuit is coupled to the CMOS circuit (CC);
a second driver circuit having a third and fourth PMOS transistor and a third and fourth NMOS transistor coupled between the first voltage and ground;
said second driver circuit being complementary to the first driver circuit and switching in the opposite direction of the first driver circuit;
wherein a gate of the second and fourth PMOS transistor is coupled to a first bias voltage and a gate of the second and fourth NMOS transistor is coupled to a second bias voltage; and
wherein a first capacitance is coupled between a gate and a drain of the fourth PMOS transistor and a second capacitance is coupled between a gate and a source of the fourth NMOS transistor.

2. Electronic device according to claim 1, wherein the size of the second driver circuit is smaller than the size of the first driver circuit.

3. Electronic device according to claim 2, further comprising:
a PMOS pre-driver circuit coupled to the gate of the first PMOS transistor,
a NMOS pre-driver circuit coupled to the gate of the first NMOS transistor,
wherein the gate of the third PMOS transistor is coupled to the PMOS pre-driver circuit or is coupled to the drain of the first PMOS transistor;
wherein the gate of the third NMOS transistor is coupled to the NMOS pre-driver circuit or is coupled to the drain of the first NMOS transistor.

4. Electronic device according to claim 1, further comprising:
a third capacitance coupled between the gate of the second PMOS transistor and ground, and
a fourth capacitance coupled between the gate of the second NMOS transistor and ground.

5. Integrated circuit, comprising:
a CMOS circuit (CC);
a first driver circuit having a first and second PMOS transistor and a first and second NMOS transistor coupled between a first voltage and ground, wherein the first driver circuit is coupled to the CMOS circuit (CC);
a second driver circuit having a third and fourth PMOS transistor and a third and fourth NMOS transistor coupled between the first voltage and ground;
said second driver circuit being complementary to the first driver circuit and switching in the opposite direction of the first driver circuit;
wherein a gate of the second and fourth PMOS transistor is coupled to a first bias voltage and a gate of the second and fourth NMOS transistor is coupled to a second bias voltage; and
wherein a first capacitance is coupled between a gate and a drain of the fourth PMOS transistor and a second capacitance is coupled between a gate and a source of the fourth NMOS transistor.

6. Transmitter comprising an electronic device according to claim 1.

* * * * *